US008743307B2

(12) United States Patent
Park et al.

(10) Patent No.: US 8,743,307 B2
(45) Date of Patent: Jun. 3, 2014

(54) DISPLAY DEVICE

(75) Inventors: Jae Woo Park, Seongnam-si (KR); Je Hun Lee, Seoul (KR); Byung Du Ahn, Hwaseong-si (KR); Sei-Yong Park, Suwon-si (KR); Jun Hyun Park, Suwon-si (KR); Gun Hee Kim, Chungbuk (KR); Ji Hun Lim, Goyang-si (KR); Kyoung Won Lee, Ansan-si (KR); Toshihiro Kugimiya, Kobe (JP); Aya Miki, Kobe (JP); Shinya Morita, Kobe (JP); Tomoya Kishi, Kobe (JP); Hiroaki Tao, Kobe (JP); Hiroshi Goto, Kobe (JP)

(73) Assignees: Samsung Display Co, Ltd., Yongin, Gyeonggi-Do (KR); Kobe Steel, Ltd., Kobe-Shi, Hyogo (JP)

( * ) Notice: Subject to any disclaimer, the term of this patent is extended or adjusted under 35 U.S.C. 154(b) by 40 days.

(21) Appl. No.: 13/490,978

(22) Filed: Jun. 7, 2012

(65) Prior Publication Data

US 2013/0114013 A1 May 9, 2013

(30) Foreign Application Priority Data

Nov. 4, 2011 (KR) ........................ 10-2011-0114749

(51) Int. Cl.
*G02F 1/136* (2006.01)
(52) U.S. Cl.
USPC ........................................................ 349/43
(58) Field of Classification Search
USPC ........................................................ 349/43
See application file for complete search history.

(56) References Cited

U.S. PATENT DOCUMENTS

| | | | |
|---|---|---|---|
| 5,972,527 | A | 10/1999 | Kaijou et al. |
| 6,727,522 | B1 | 4/2004 | Kawasaki et al. |
| 6,878,962 | B1 | 4/2005 | Kawasaki et al. |
| 7,061,014 | B2 | 6/2006 | Hosono et al. |
| 7,067,843 | B2 | 6/2006 | Carcia et al. |
| 7,145,174 | B2 | 12/2006 | Chiang et al. |
| 7,189,992 | B2 | 3/2007 | Wager, III et al. |

(Continued)

FOREIGN PATENT DOCUMENTS

| | | |
|---|---|---|
| CN | 101312912 | 11/2008 |
| JP | 05-251705 | 9/1993 |

(Continued)

OTHER PUBLICATIONS

Min Ki Ryu et al., "Impact of Sn/Zn ratio on the gate bias and temperature-induced instability of Zn—In—Sn—O thin film transistors", Applied Physics Letters 95, 123508 (2009).

(Continued)

*Primary Examiner* — Phu Vu
(74) *Attorney, Agent, or Firm* — F. Chau & Associates, LLC

(57) ABSTRACT

A display device includes a first substrate, a gate line disposed on the first substrate and including a gate electrode, a gate insulating layer disposed on the gate line, a semiconductor layer disposed on the gate insulating layer, a data line disposed on the semiconductor layer and connected to a source electrode, a drain electrode disposed on the semiconductor layer and facing the source electrode and a passivation layer disposed on the data line, in which the semiconductor layer is formed of an oxide semiconductor including indium, tin, and zinc. The indium is present in an amount of about 5 atomic percent (at %) to about 50 at %, and a ratio of the zinc to the tin is about 1.38 to about 3.88.

20 Claims, 13 Drawing Sheets

(56) References Cited

U.S. PATENT DOCUMENTS

| | | |
|---|---|---|
| 7,211,825 B2 | 5/2007 | Shih et al |
| 7,297,977 B2 | 11/2007 | Hoffman et al. |
| 7,339,187 B2 | 3/2008 | Wager, III et al. |
| 7,393,600 B2 | 7/2008 | Inoue et al. |
| 7,732,251 B2 | 6/2010 | Hoffman et al. |
| 2005/0017244 A1 | 1/2005 | Hoffman et al. |
| 2006/0108636 A1 | 5/2006 | Sano et al. |
| 2006/0113536 A1 | 6/2006 | Kumomi et al. |
| 2006/0113549 A1 | 6/2006 | Den et al. |
| 2006/0113565 A1 | 6/2006 | Abe et al. |
| 2007/0023750 A1 | 2/2007 | Chiang et al. |
| 2007/0052025 A1 | 3/2007 | Yabuta |
| 2007/0194379 A1 | 8/2007 | Hosono et al. |
| 2008/0254569 A1 | 10/2008 | Hoffman et al. |
| 2009/0090914 A1 | 4/2009 | Yano et al. |
| 2009/0189153 A1 | 7/2009 | Iwasaki et al. |
| 2009/0267064 A1 | 10/2009 | Yano et al. |
| 2009/0278122 A1 | 11/2009 | Hosono et al. |
| 2009/0280600 A1 | 11/2009 | Hosono et al. |
| 2011/0128038 A1 | 6/2011 | Ko |
| 2011/0284836 A1 | 11/2011 | Lee et al. |

FOREIGN PATENT DOCUMENTS

| | | |
|---|---|---|
| JP | 2007-142196 | 6/2007 |
| JP | 417054 B2 | 8/2008 |
| JP | 4164562 B2 | 8/2008 |
| JP | 4170454 | 8/2008 |
| JP | 2009-123957 | 6/2009 |
| JP | 2010-045263 | 2/2010 |
| KR | 1020080069607 | 7/2008 |
| KR | 1020080074889 | 8/2008 |
| KR | 1020110124530 | 11/2011 |
| KR | 1020110128038 | 11/2011 |
| WO | 03/040441 | 5/2003 |
| WO | 2007032294 | 3/2007 |
| WO | 2007058232 | 5/2007 |
| WO | 2009064007 | 5/2009 |

OTHER PUBLICATIONS

Min Ki Ryu et al., "High performance thin film transistor with cosputtered amorphous Zn—In—Sn—O channel: Combinatorial approach", Applied Physics Letters 95, 072104 (2009).

US2011-0284836 corresponds to KR 10-2011-0128038.

DISPLAY DEVICE

CROSS-REFERENCE TO RELATED APPLICATION

This application claims priority to Korean Patent Application No. 10-2011-0114749 filed on Nov. 4, 2011, the disclosure of which is hereby incorporated herein by reference herein in its entirety.

(a) Technical Field

The present disclosure relates to a display device.

(b) Description of the Related Art

A flat panel display such as, for example, a liquid crystal display (LCD), an organic light emitting diode (OLED) display, an electrophoretic display, and a plasma display includes a plurality of pairs of field generating electrodes and an electro-optical active layer interposed therebetween. The liquid crystal display includes a liquid crystal layer as the electro-optical active layer and the organic light emitting diode display includes an organic emission layer as the electro-optical active layer. One of the field generating electrodes making a pair with each other may be connected to a switching element to receive an electric signal and the electro-optical active layer may convert the electric signal into an optical signal, thereby displaying an image.

The flat panel display may include a display panel on which a thin film transistor is formed. Multilayered electrodes, a semiconductor, or the like may be patterned on a thin film transistor array panel. Also, a mask may be used in the patterning process.

Meanwhile, the semiconductor layer may be a significant factor in determining characteristics of the thin film transistor. In forming the semiconductor layer, amorphous silicon is often used, but there may be a limit in manufacturing a high performance thin film transistor because the amorphous silicon may have low charge mobility. Further, in the case where polysilicon is used to form a semiconductor layer, since charge mobility may be high, a high performance thin film transistor may be readily manufactured. However, when polysilicon is used, manufacturing costs may rise and uniformity may be reduced, and consequently, there may be a limit in fabricating a large-sized thin film transistor array panel.

For this reason, research in connection with a thin film transistor using a semiconductor layer formed of an oxide semiconductor which has higher electron mobility and a higher ON/OFF ratio of current than the amorphous silicon, and which lowers manufacturing costs and has high uniformity compared to the polysilicon, is being conducted.

For example, research in connection with the use of zinc oxide (ZnO), tin oxide ($SnO_2$), and zinc-tin oxide (ZnSnO), or the like for the oxide semiconductor of a semiconductor layer is being conducted. However, since characteristics and an etching characteristic of the thin film transistor may vary according to a composition of constituent material constituting the oxide semiconductor, suitable conditions for actually manufacturing a display device using the oxide semiconductor should be satisfied.

SUMMARY

Exemplary embodiments of the present invention may provide a display device including an oxide semiconductor having beneficial driving characteristics and satisfying conditions for actual mass production such as in a four-sheet process.

An exemplary embodiment of the present invention provides a display device including: a first substrate, a gate line disposed on the first substrate and including a gate electrode, a gate insulating layer disposed on the gate line; a semiconductor layer disposed on the gate insulating layer, a data line disposed on the semiconductor layer and connected to a source electrode, a drain electrode disposed on the semiconductor layer and facing the source electrode and a passivation layer disposed on the data line, in which the semiconductor layer is formed of an oxide semiconductor including indium, tin, and zinc. The indium is present in an amount of about 5 atomic percent (at %) to about 50 at %, and a ratio of the zinc to the tin is about 1.38 to about 3.88.

The indium may be present in an amount of about 10 at % to about 30 at % and the ratio of the zinc to the tin may be about 1.78 to about 2.95.

An etch rate of the semiconductor layer may be about 10 Å/second to about 200 Å/second.

The semiconductor layer may have a same planar pattern as the source electrode, the drain electrode, and the data line except for a channel portion formed in the semiconductor layer.

The threshold voltage (Vth) of the semiconductor layer may be no less than about −10V.

Charge mobility of the semiconductor layer may be about 5 cm2/Vs.

The gate insulating layer may include a lower layer and an upper layer.

The lower layer may be made of silicon oxide.

The upper layer may be made of silicon nitride.

The display device may further include a pixel electrode disposed on the passivation layer, in which the passivation layer has a contact hole and the pixel electrode is connected to the drain electrode through the contact hole.

The display device may further include a second substrate facing the first substrate, in which a liquid crystal layer is interposed between the first substrate and the second substrate.

The etch rate of the semiconductor layer may be about 10 Å/second to about 200 Å/second.

The semiconductor layer may have a same planar pattern as the source electrode, the drain electrode, and the data line except for a channel portion formed in the semiconductor layer.

The gate insulating layer may include a lower layer and an upper layer.

The lower layer may be made of silicon oxide and the upper layer may be made of silicon nitride.

The display device may further include a pixel electrode disposed on the passivation layer, in which the passivation layer has a contact hole and the pixel electrode is connected to the drain electrode through the contact hole.

The indium may be present in an amount of about 10 at % and the ratio of the zinc to the tin may be about 1.78 to about 3.88.

The indium may be present in amount of about 20 at % and the ratio of the zinc to the tin may be about 1.50 to about 3.23.

The indium may be present in an amount of about 30 at % and the ratio of the zinc to the tin may be about 1.38 to about 2.95.

An exemplary embodiment of the present invention provides a display device including: a first substrate, a gate line disposed on the first substrate and including a gate electrode, a gate insulating layer disposed on the gate line, a semiconductor layer disposed on the gate insulating layer, a data line disposed on the semiconductor layer and connected to a source electrode, a drain electrode disposed on the semiconductor layer and facing the source electrode and a passivation layer disposed on the data line, in which the semiconductor layer is formed of an oxide semiconductor including indium, tin, and zinc. The indium is present in an amount of about 5 atomic percent (at %) to about 50 at %, the zinc is present in an amount of about 25 at % to about 71.6 at %, and the tin is present in an amount of about 16.1 at % to about 33.3 at %.

According to an exemplary embodiment of the present invention, it is possible to implement a display device which has beneficial charge mobility and to collectively etch metal wiring and the oxide semiconductor by using an oxide semiconductor which includes indium, zinc, and tin and by adjusting atomic concentration ratios of indium, zinc, and tin.

DETAILED DESCRIPTION OF EXEMPLARY EMBODIMENTS

Figure 1:
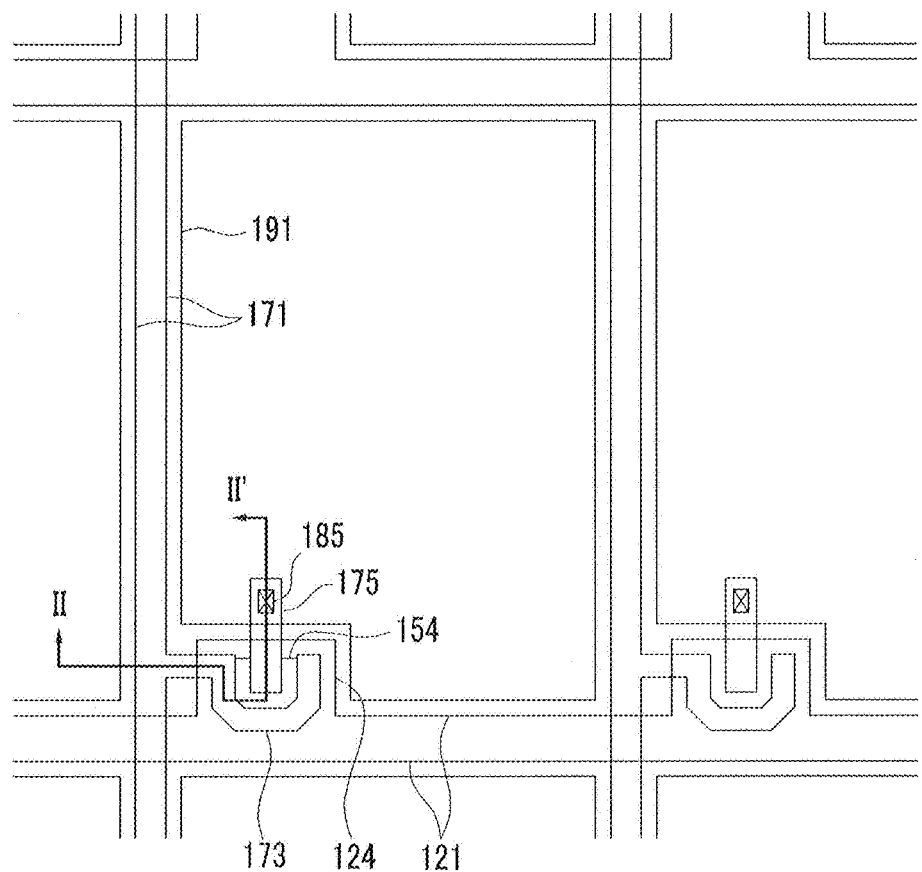
FIG. 1 is a layout view illustrating a thin film transistor array panel according to an exemplary embodiment of the present invention.

Hereinafter, exemplary embodiments of the present invention will be described in detail with reference to the accompanying drawings. As those, skilled in the art would realize, exemplary embodiments of the present invention may be modified in various different ways, all without departing from the spirit or scope of the present invention.

In the drawings, the thickness of layers, films, panels, regions, etc., are exaggerated for clarity. It will be understood that when a layer is referred to as being "on" another layer or substrate, it can be directly on the other layer or substrate or one or more intervening layers may also be present. Like reference numerals designate like elements throughout the specification. As used herein, the singular forms, "a", "an" and "the" are intended to include the plural forms as well, unless the context clearly indicates otherwise.

Figure 2:
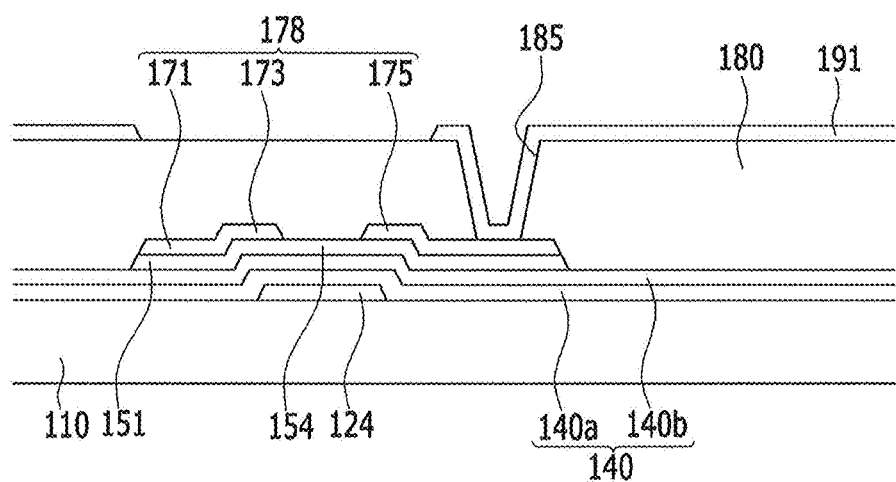
FIG. 2 is a cross-sectional view taken along line II-II' of FIG. 1.

FIG. 1 is a layout view illustrating a thin film transistor array panel according to an exemplary embodiment of the present invention. FIG. 2 is a cross-sectional view taken along line II-II' of FIG. 1.

Referring to FIGS. 1 and 2, a plurality of gate lines 121 are formed on a first substrate 110 made of, for example, transparent glass, plastic, or the like.

The gate lines 121 transfer gate signals and substantially extend in, for example, a horizontal direction. However, exemplary embodiments of the present invention are not limited to the above direction for the gate lines 121 but rather, alternatively, the gate lines 121 may instead extend in a vertical direction. Each of the gate lines 121 includes a plurality of gate electrodes 124 protruding from the gate line 121.

The gate lines 121 and the gate electrodes 124 may be made of, for example, one selected from among aluminum-based metal such as aluminum (Al) and an aluminum alloy, silver-based metal such as silver (Ag) and a silver alloy, and copper-based metal such as copper (Cu) and a copper alloy. Further, the gate lines 121 and the gate electrodes 124 may each also be formed of one of the following other materials selected from among, for example, a gold-based metal such as gold (Au) and a gold alloy, a nickel-based metal such as Nickel (Ni) and a nickel alloy, niobium-based metal such as niobium (Nb) and a niobium alloy, and a neodymium-based metal such as neodymium (Nd) and a neodymium alloy, a molybdenum-based metal such as molybdenum (Mo) and a molybdenum alloy, chromium (Cr), a chromium alloy, titanium (Ti), a titanium alloy, tantalum (Ta), a tantalum alloy, manganese (Mn), and a manganese alloy.

In the present exemplary embodiment, the gate line 121 and the gate electrode 124 are formed in a single-layer structure, but are not limited thereto and may be formed in a dual-layer or triple-layer structure.

For example, in the case of the dual-layer structure, each of the gate line 121 and the gate electrode 124 may include a lower layer and an upper layer and the lower layer may be made of one selected from among molybdenum-based metal such as molybdenum (Mo) and a molybdenum alloy, chromium (Cr), a chromium alloy, titanium (Ti), a titanium alloy, tantalum (Ta), a tantalum alloy, manganese (Mn), and a manganese alloy. The upper layer may be made of, for example, one selected from among an aluminum-based metal such as aluminum (Al) and an aluminum alloy, a silver-based metal such as silver (Ag) and a silver alloy, and a copper-based metal such as copper (Cu) and a copper alloy. The triple-layer structure may be formed by combining layers having different physical properties. Alternatively, for example, the lower layer of the gate line 121 and the gate electrode 124 may instead include, for example, an aluminum-based metal such as aluminum (Al) and an aluminum alloy, a silver-based metal such as silver (Ag) and a silver alloy, and a copper-based metal such as copper (Cu) and a copper alloy and the upper layer of the gate line 121 and the gate electrode 124 may instead include one selected from among a molybdenum-based metal such as molybdenum (Mo) and a molybdenum alloy, chromium (Cr), a chromium alloy, titanium (Ti), a titanium alloy, tantalum (Ta), a tantalum alloy, manganese (Mn), and a manganese alloy.

A gate insulating layer 140 may formed on the gate line 121. The gate insulating layer 140 may include, for example, a first gate insulating layer 140a and a second gate insulating layer 140b. The first gate insulating layer 140a may be made of, for example, silicon nitride (SiNx) having a thickness of about 4000 Å and the second gate insulating layer 140b may be made of silicon oxide ($SiO_2$) having a thickness of about 500 Å. In an exemplary embodiment, the first gate insulating layer 140a may be made of, for example, silicon-oxynitride (SiON) and the second gate insulating layer 140b may be made of silicon oxide ($SiO_2$). In the present exemplary embodiment, the gate insulating layer 140 includes the first and second gate insulating layers 140a and 140b in a dual-layer structure, but the gate insulating layer 140 may alternatively preformed in a single-layer structure.

A plurality of semiconductor layers 151 made of, for example, an oxide semiconductor are formed on the gate insulating layer 140. The semiconductor layers 151 substantially extend in, for example, a vertical direction and include a plurality of projections 154 protruding toward the gate electrodes 124.

The oxide semiconductor according to the present exemplary embodiment comprises, for example, indium (In), zinc (Zn), and tin (Sn). Indium is added to increase a charge mobility characteristic by using the oxide semiconductor.

The amount of indium included in the oxide semiconductor according to the present exemplary embodiment is, for example, about 5 atomic percent (at %) to about 50 at %. This range is a numerical range to secure the minimum threshold voltage Vth of about −10 V for driving a thin film transistor.

The resistivity of the oxide semiconductor according to the present exemplary embodiment is about $5*10^{-2}$ [Ωcm] or less. An oxide semiconductor target including indium, zinc, and tin having indium present in the range of about 5 at % to about 50 at % is applied to an AC sputter or a DC sputter to form the semiconductor layers 151 of the present exemplary embodiment.

Further, to form a plurality of data lines 171, a plurality of source electrodes 173, and a plurality of drain electrodes 175 disposed on the semiconductor layers 151 and the semiconductor layers 151 using the same etchant, an atomic concentration ratio of zinc to tin which are included in the oxide semiconductor may be, for example, about 1.38 to about 3.88. Herein, the atomic concentration ratio of zinc to tin refers to a value obtained by dividing an atomic percent (at %) of zinc by an atomic percent (at %) of tin.

The etch rate of the semiconductor layer 151 in relation to the aforementioned atomic concentration ratio of zinc to tin is, for example, about 10 Å/second to about 200 Å/second. This case will be described in detail below.

The plurality of data lines 171 and the plurality of drain electrodes 175 connected to the plurality of source electrodes 173, respectively are formed on the semiconductor layers 151.

The data lines 171 transfer data signals and substantially extend in a vertical direction to cross the gate lines 121. It is noted, however, that exemplary embodiments of the present invention are not limited to the above direction for the data lines 171 but rather, alternatively, the data lines 171 may instead extend in a horizontal direction to cross the gate lines 121. The respective data lines 171 extend toward the gate electrodes 124 and are connected to the plurality of source electrodes 173 having, for example, a U shape.

The drain electrode 175 is separated from the data line 171 and extends upward from the center of the U shape of the source electrode 173. The aforementioned shape of the source electrode 173 and the drain electrode 175 is an example and may be modified in various ways.

A data wiring layer 178 including the data line 171, the source electrode 173 and the drain electrode 175 may be made of one selected from among an aluminum-based metal such as, for example, aluminum (Al) and an aluminum alloy, a silver-based metal such as silver (Ag) and a silver alloy, a copper-based metal such as copper (Cu) and a copper alloy. Furthermore, the data lines 171, the source electrodes 173 and the drain electrodes 175 may each also be formed of one of the following other materials selected from among, for example, a gold-based metal such as gold (Au) and a gold alloy, a nickel-based metal such as Nickel (Ni) and a nickel alloy, niobium-based metal such as niobium (Nb) and a niobium alloy, and a neodymium-based metal such as neodymium (Nd) and a neodymium alloy, a molybdenum-based metal such as molybdenum (Mo) and a molybdenum alloy, chromium (Cr), a chromium alloy, titanium (Ti), a titanium alloy, tantalum (Ta), a tantalum alloy, manganese (Mn), and a manganese alloy.

In the present exemplary embodiment, the data line 171, the source electrode 173, and the drain electrode 175 are formed in a single layer structure, but are not limited thereto and may be formed in a dual-layer or triple-layer structure.

For example, in the case of the dual-layer structure, each of the data line 171, the source electrode 173, and the drain electrode 175 may include a lower layer and an upper layer. The lower layer may be made of, for example, one selected from among a molybdenum-based metal such as molybdenum (Mo) and a molybdenum alloy, chromium (Cr), a chromium alloy, titanium(Ti), a titanium alloy, tantalum (Ta), a tantalum alloy, manganese (Mn), and a manganese alloy and the upper layer may be made of, for example, one selected from among an aluminum-based metal such as aluminum (Al) and an aluminum alloy, a silver-based metal such as silver (Ag) and a silver alloy, a copper-based metal such as copper (Cu) and a copper alloy. A tri-layer structure may be formed by combining layers having different physical properties. Alternatively, for example, the lower layer of the data line 171, source electrode 173 and the drain electrode 175 may instead include an aluminum-based metal such as aluminum (Al) and an aluminum alloy, a silver-based metal such as silver (Ag) and a silver alloy, and a copper-based metal such as copper (Cu) and a copper alloy and the upper layer of the data line 171, source electrode 173 and the drain electrode 175 may instead include one selected from among a molybdenum-based metal such as molybdenum (Mo) and a molybdenum alloy, chromium (Cr), a chromium alloy, titanium (Ti), a titanium alloy, tantalum (Ta), a tantalum alloy, manganese (Mn), and a manganese alloy.

The projection 154 of the semiconductor layer 151 has an exposed portion which is formed between the source electrode 173 and the drain electrode 175 and is not covered by the data line 171 and the drain electrode 175. The semiconductor layer 151 has, for example, substantially a same planar pattern as the data line 171, the source electrode 173, and the drain electrode 175 except for the exposed portion of the projection 154. That is, lateral walls of the data line 171, the source electrode 173, and the drain electrode 175 may be aligned to be substantially the same as lateral side walls of the semiconductor layer 151 disposed therebelow. The reason why the pattern is formed is that the data wiring layers 178 including the data line 171, the source electrode 173, and the drain electrode 175 and the semiconductor layer 151 are formed by using the same mask and etchant. Since the data wiring layers 178 are formed by wet etching, the semiconductor layer 151 should also be subjected to wet etching so as to collectively etch the data wiring layers 178 and the semiconductor layer 151. Since even the second gate insulating layer 140b of the gate insulating layers disposed beneath the semiconductor layer 151 is also etched during the wet etching of the semiconductor layer 151, it may be necessary to consider deterioration in an etching profile. Since the second insulating layer 140b may be made of silicon oxide ($SiO_2$) to have an etch rate of about 1.6 Å/second, the semiconductor layer 151 should be etched within about 80% of an over etch rate of the data wiring layers 178 disposed on the semiconductor layer 151. Accordingly, in the present exemplary embodiment, an etch rate of the semiconductor layer 151 is about 10 Å/second to about 200 Å/second.

One gate electrode 124, one source electrode 173, and one drain electrode 175 form one thin film transistor (TFT) together with the projection 154 of the semiconductor layer 151 and a channel of the thin film transistor is formed on the projection 154 between the source electrode 173 and the drain electrode 175.

A passivation layer 180 is formed on the data line 171, the drain electrode 175, and the exposed portion of the projection 154 of the semiconductor layer. For example, the passivation layer 180 may be formed of an organic material, such as benzocyclobutene (BCB), an acrylic resin, or methacrylic resin or an inorganic material such as silicon nitride, silicon oxide, or silicon oxynitride. However, any organic or inorganic materials may be used for forming the passivation layer 180.

A plurality of pixel electrodes 191 are formed on the passivation layer 180. The pixel electrode 191 is physically and electrically connected to the drain electrode 175 through a contact hole 185 and receives data voltage from the drain electrode 175.

As described above, the thin film transistor array panel 100 of the present exemplary embodiment includes a semiconductor layer made of the oxide semiconductor including indium, zinc, and tin. Hereinafter, a liquid crystal display will be described as an example of a display device including a thin film transistor array panel 100 according to the present exemplary embodiment, with reference to FIG. 3.

Figure 3:
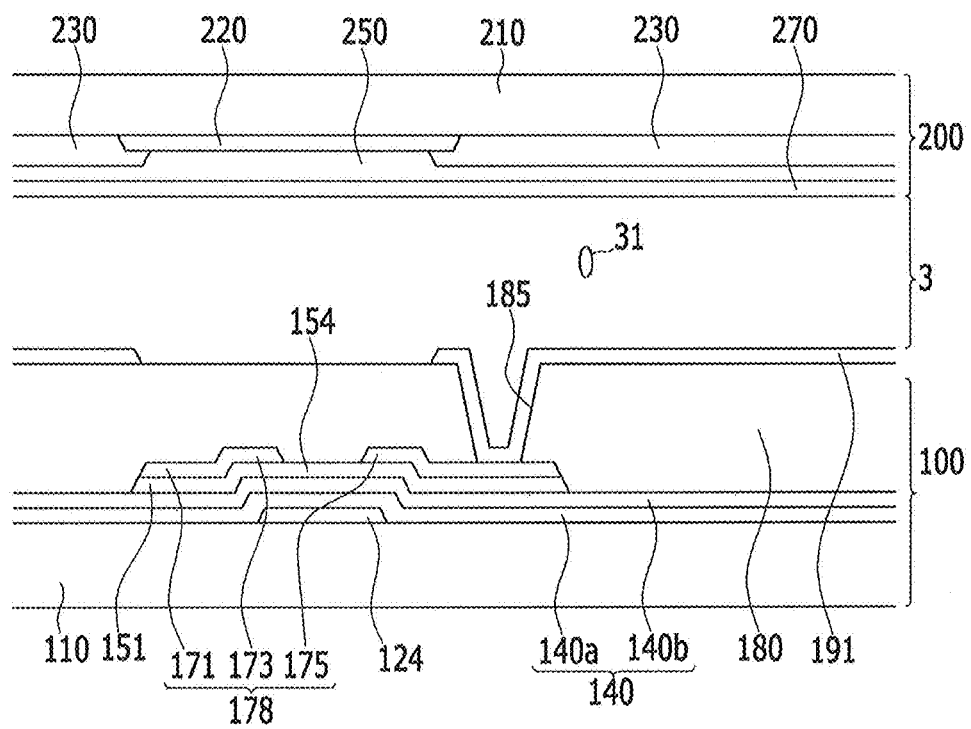
FIG. 3 is a cross-sectional view illustrating a liquid crystal display according to an exemplary embodiment of the present invention.

FIG. 3 is a cross-sectional view illustrating a liquid crystal display according to an exemplary embodiment of the present invention.

Referring to FIG. 3, a second substrate 210 is disposed opposite to a first substrate 110. The second substrate 210 may be an insulation substrate made of, for example, transparent glass, plastic, or the like. A light blocking member 220 is formed on the second substrate 210. The light blocking member 220 is also referred to as a black matrix and prevents light leakage. Alternatively, the light blocking member 220 may be omitted.

Further, a plurality of color filters 230 are formed on the second substrate 210 and the light blocking member 220. The color filters 230, for example, are adjacent to the area surrounded by the light blocking member 220 and may extend along a column of the pixel electrodes 191. Each of the color filters 230 may display one of primary colors such as, for example, three primary colors of red, green, and blue, or the like. However, each of the color filters 230 is not limited to the three primary colors of red, green, and blue, but may display one of, for example, cyan, magenta, yellow, and white.

For example, at least one of the light blocking members 220 and the color filters 230 may be formed on the first display panel 100. In the present exemplary embodiment, the first display panel 100 may be, for example, a thin film transistor array panel. Alternatively, both the light blocking member 220 and the color filters may instead be formed on the first display panel 100, An overcoat 250 is formed on the color filters 230 and the light blocking members 220. The overcoat 250 may be made of, for example, an insulating material which prevents the color filters 230 from be exposed, and provides a flat surface. The overcoat 250 may be omitted.

A common electrode 270 is formed on the overcoat 250.

The pixel electrode 191 supplied with data voltage generates an electric field together with the common electrode 270 receiving common voltage, thereby determining the direction of a liquid crystal molecule 31 of a liquid crystal layer 3 between the two electrodes. The pixel electrode 191 and the common electrode 270 form a capacitor to maintain applied voltage even after a thin film transistor is turned off.

The pixel electrode 191 overlaps a storage electrode line (not shown) to form a storage capacitor, thereby enhancing voltage storage capacity of a liquid crystal capacitor.

The pixel electrode 191 may be made of a transparent conductor such as, for example, indium tin oxide (ITO) or indium zinc oxide (IZO). Other materials which may be used to form the pixel electrode 191 include, for example, zinc oxide (ZnO), indium oxide ($In_2O_3$), tin oxide ($SnO_2$), aluminum zinc oxide (AZO) or gallium zinc oxide (GZO).

In addition, for example, in exemplary embodiments, an alignment layer may be formed on at least one of the first display panel 100 and the second display panel 200 for aligning liquid crystal molecules 31 in the liquid crystal layer 3 in a desired direction.

As described above, the thin film transistor array panel 100 according to the present exemplary embodiment may be applied to a liquid crystal display, but the present exemplary embodiment is not limited thereto. Rather, the thin film transistor array panel of the present exemplary embodiment may also be widely applied to, for example, display devices performing a switching operation using an organic light emitting diode display and other thin film transistors.

Hereinafter, an oxide semiconductor according to an exemplary embodiment of the present invention will be described in detail.

Figure 4:
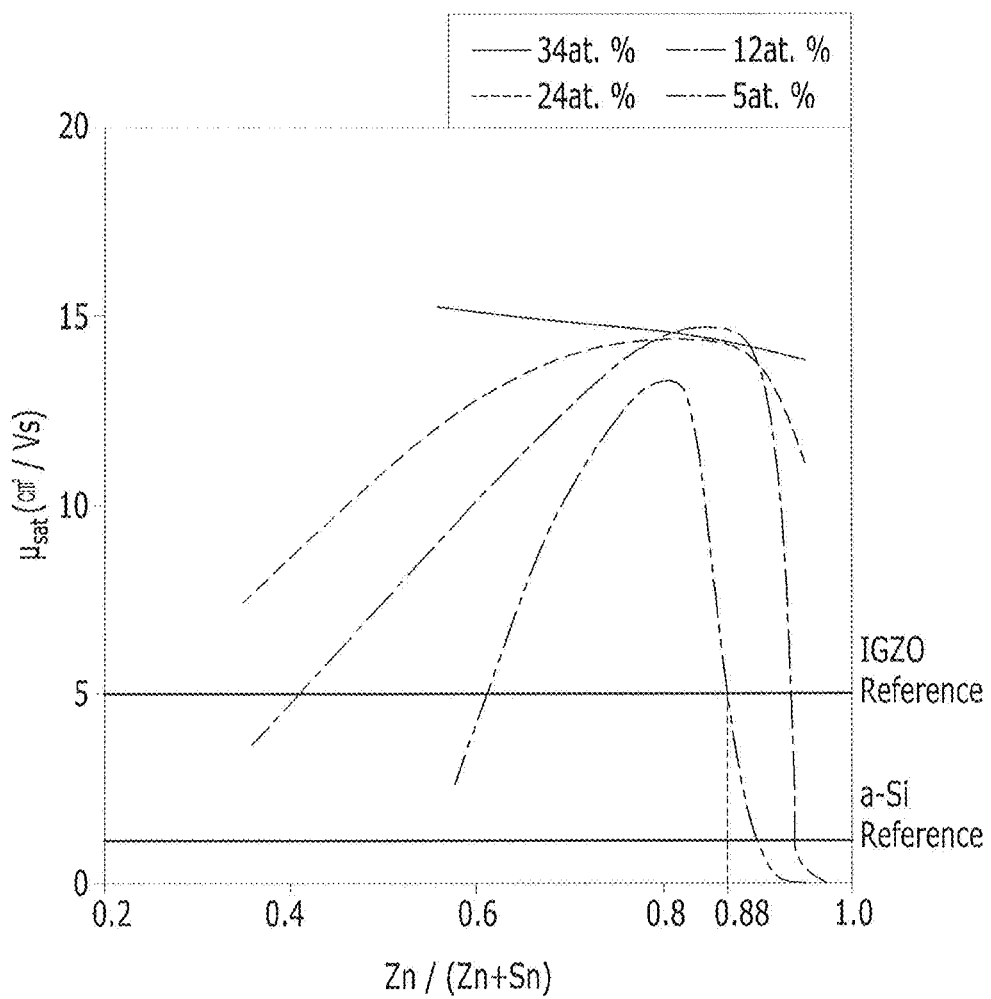
FIG. 4 is a graph illustrating a mobility characteristic according to a ratio of tin and zinc.

FIG. 4 is a graph illustrating a mobility characteristic according to a ratio of tin and zinc.

Referring to FIG. 4, an oxide semiconductor comprising indium-gallium-zinc-oxide and having a charge mobility of about 5 cm2/Vs is set as a reference and amorphous silicon (a-Si) having a charge mobility less than the charge mobility of the indium-gallium-zinc-oxide is also used as a reference. In addition, FIG. 4 illustrates an oxide semiconductor in accordance with the present exemplary embodiment including tin instead of gallium, in which the composition of the oxide semiconductor may be set to have charge mobility of about 5 cm2/Vs or more so as to increase characteristics of the thin film transistor.

A horizontal axis of FIG. 4 represents a ratio of zinc to an atomic percent of zinc and tin and a vertical axis represents charge mobility. As the ratio of zinc increases, a value of charge mobility rises and then, falls. Further, as an atomic percent of indium increases, a range of the ratio of zinc in which the charge mobility is about 5 cm2/Vs or more is apt to grow.

According to the present exemplary embodiment, when an atomic percent of indium is about 5 at % or more, the ratio of zinc to the total content of tin and zinc may be about 0.88 or less so that the charge mobility is about 5 cm2/Vs or more.

Figure 5:
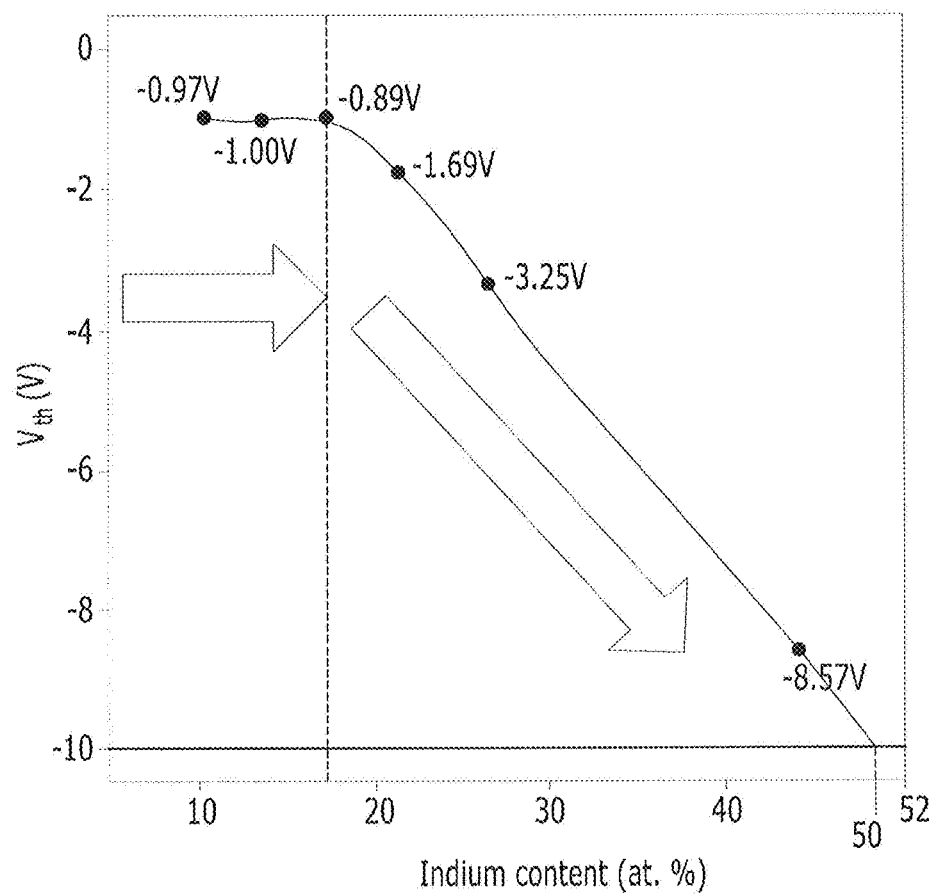
FIG. 5 is a graph illustrating a threshold voltage characteristic according to an atomic percent of indium.

FIG. 5 is a graph illustrating a threshold voltage characteristic according to an atomic percent of indium.

Referring to FIG. 5, as the atomic percent of indium in the oxide semiconductor according to the present exemplary embodiment increases, the threshold voltage Vth decreases. As shown in FIG. 5, the atomic percent of indium is 50 at % at a point where a line denoting the threshold voltage is extended and intersects with a horizontal axis denoting the threshold voltage of about −10V.

It may be necessary to secure the minimum threshold voltage Vth of about −10V for driving the thin film transistor included in the display device according to an exemplary embodiment of the present invention. Therefore, the oxide semiconductor according to the present exemplary embodiment includes of indium in an amount of about 5 at % to about 50 at %.

Figure 6:
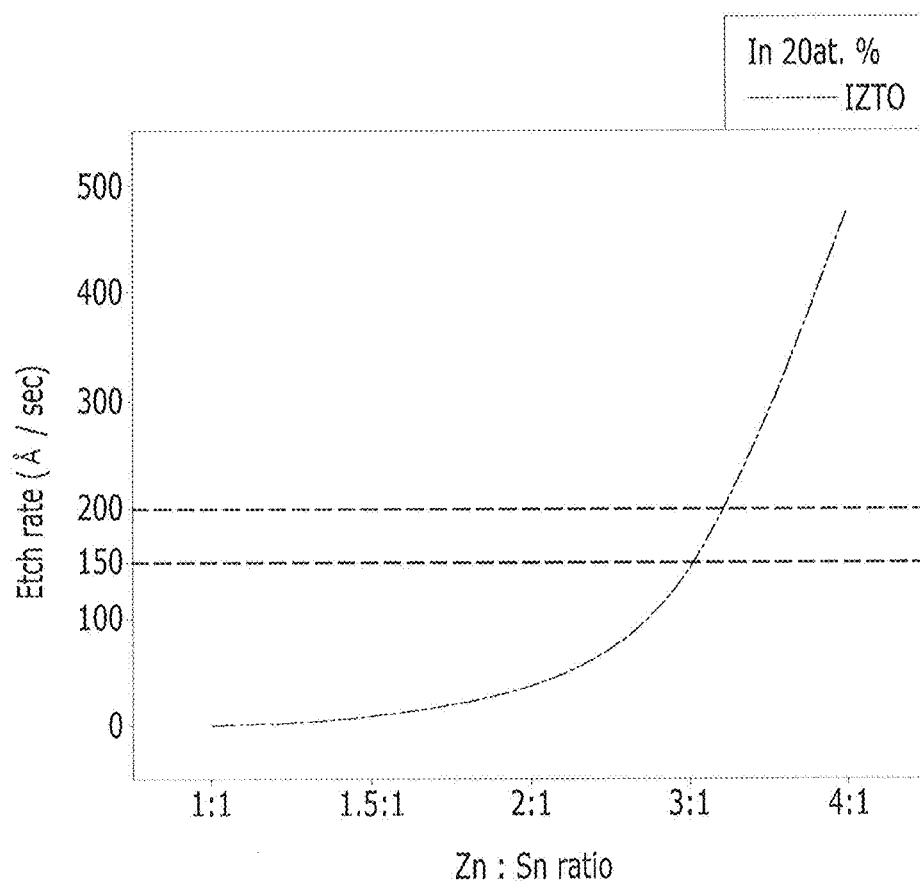
FIG. 6 is a graph illustrating an etch rate according to a ratio of zinc to tin.
Figure 7:
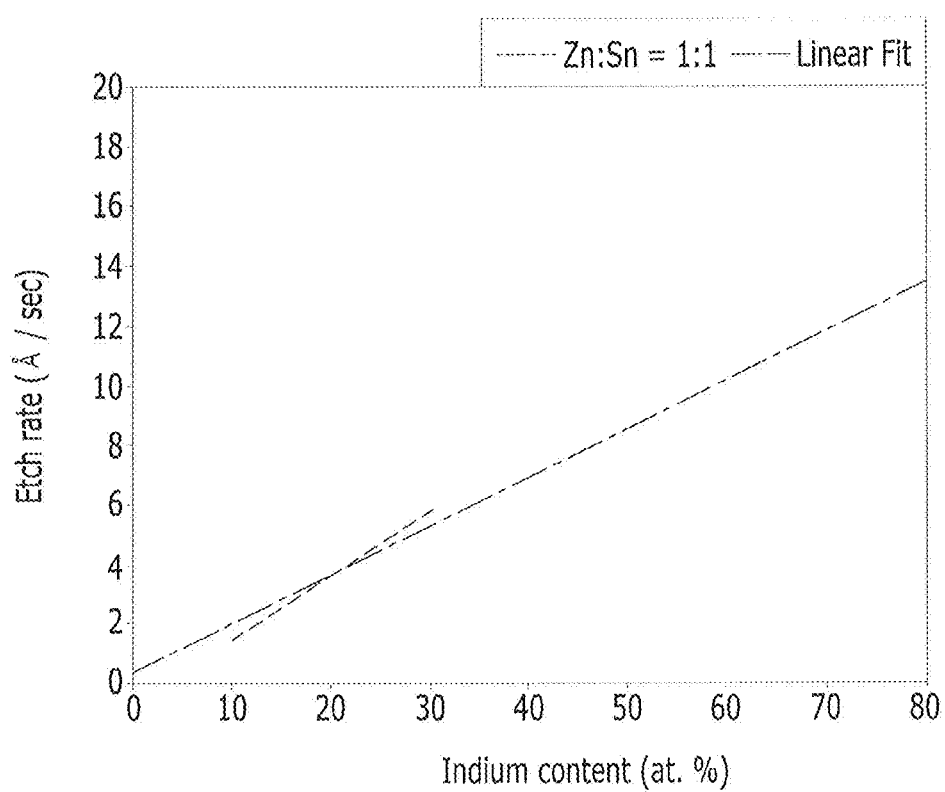
FIG. 7 is a graph illustrating an etch rate according to an atomic percent of indium.

FIG. 6 is a graph illustrating an etch rate according to a ratio of zinc to tin. FIG. 7 is a graph illustrating an etch rate according to an atomic percent of indium.

FIGS. 6 and 7 illustrates etch rates varying according to a composition of indium, zinc, and tin. As shown in FIG. 6, when the atomic percent of indium is 20 at % and as an atomic concentration ratio of zinc to tin increases, the etch rate increases exponentially In addition, as shown in FIG. 7, when the atomic concentration ratio of zinc to tin is 1 and as the atomic percent of indium increases, the etch rate increases linearly.

Figure 8:
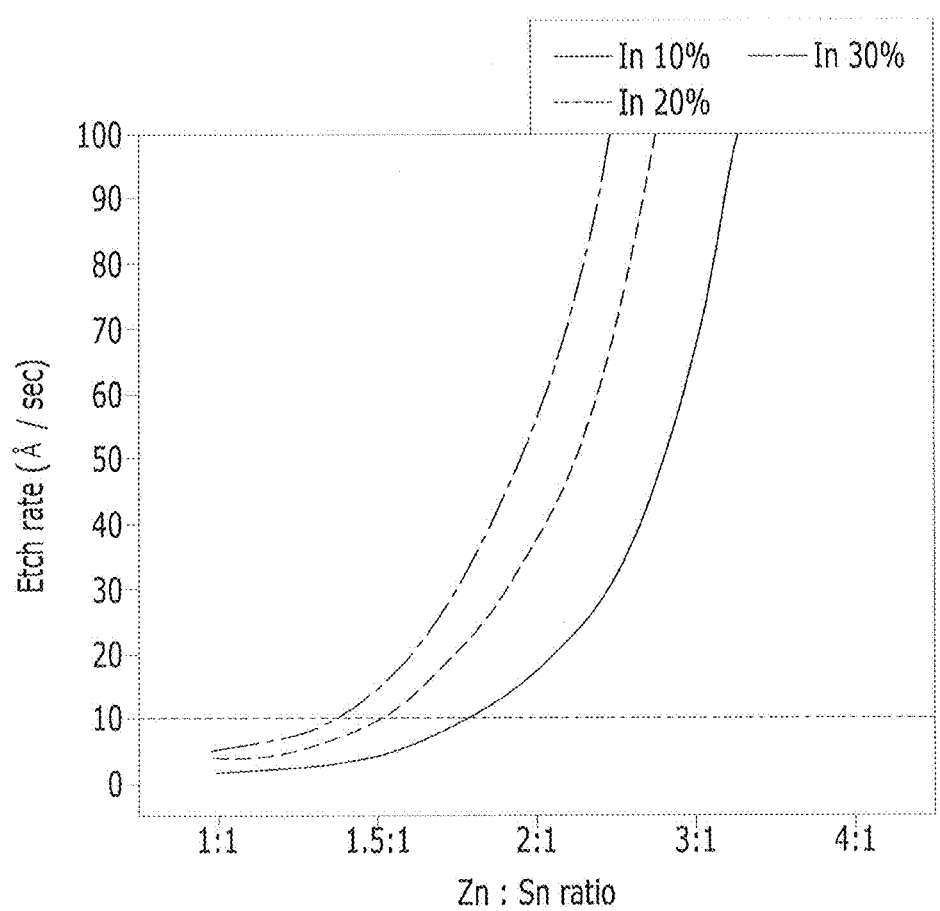
FIGS. 8 and 9 are graphs illustrating etch rates according to ratios of tin, zinc, and indium.
Figure 9:
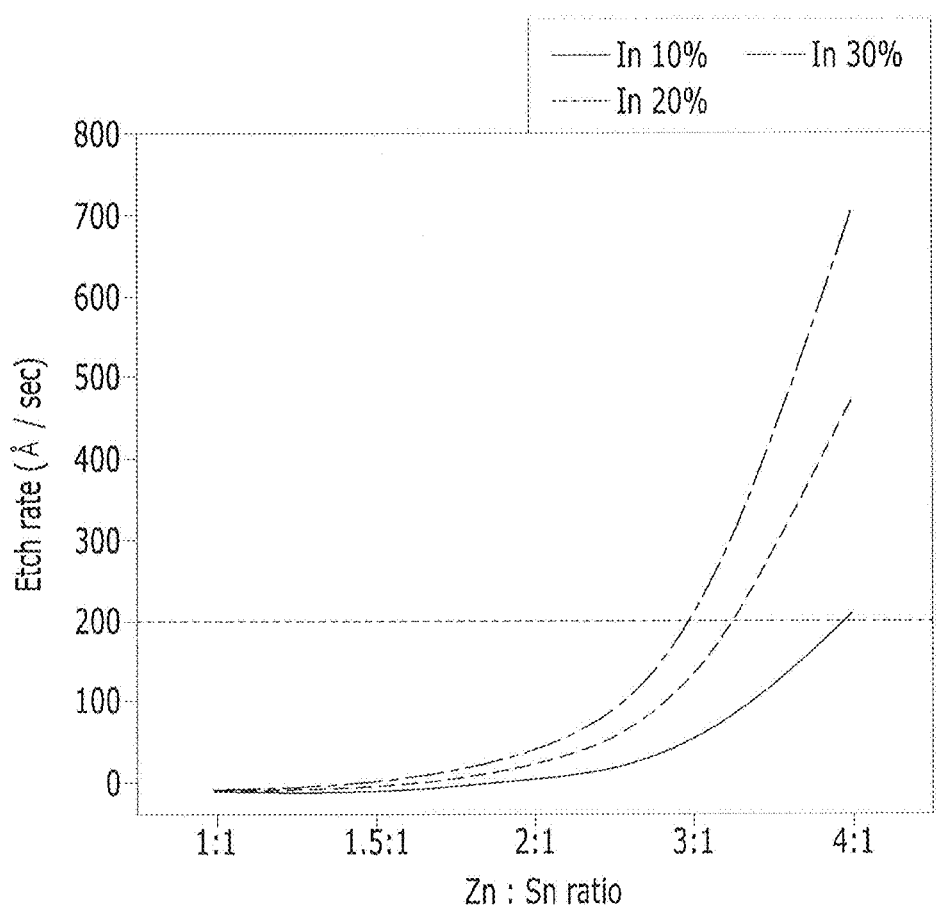

FIGS. 8 and 9 are graphs illustrating etch rates according to ratios of tin, zinc, and indium.

Referring to FIG. 2, FIG. 8 and FIG. 9, the etch rate of the semiconductor layer 151 should be about 10 Å/second or more to prevent the gate insulating layer deposed beneath the semiconductor layer 151 from being etched and prevent a cut dimension (CD) skew or an undercut of the source electrode 173 and the drain electrode 175 from being generated. When the etch rate of the semiconductor layer 151 is too large, a difficulty may arise from the viewpoint of CD skew and undercut of the semiconductor layer 151, in which etching is continuously performed even during a transportation time which may be regarded as a process margin from the viewpoint of mass production. As a result of the etch rate of the semiconductor layer 151 being too large, it may be difficult to form the pattern. Therefore, the etch rate of the semiconductor layer 151 may be limited to about 200 Å/second. Herein, the term CD skew means a distance between an end of the data wiring layers 178 and an end of the semiconductor layer 151 and the term undercut means that a lower end of a layer to be etched is more etched than an upper end thereof.

Referring to FIG. 8, when the atomic concentration ratio of indium is about 10 at % or more, the ratio of zinc to tin (Zn:Sn) in the present exemplary embodiment may be about 1.38 or more for the etch rate to be about 10 Å/second or more.

Referring to FIG. 9, when the atomic concentration ratio of indium is about 10 at % or more, the ratio of zinc to tin (Zn:Sn) in the present exemplary embodiment may be about 3.88 or less for the etch rate to be about 200 Å/second or less.

In an exemplary embodiment, the indium may be present in an amount of, for example, about 10 at % to about 30 at % and the ratio of zinc to tin may be about 1.78 to about 2.95.

The etch rate condition described above may have some margins, and thus the etchant and/or the temperature conditions may be changed during the etching process.

Figure 10:
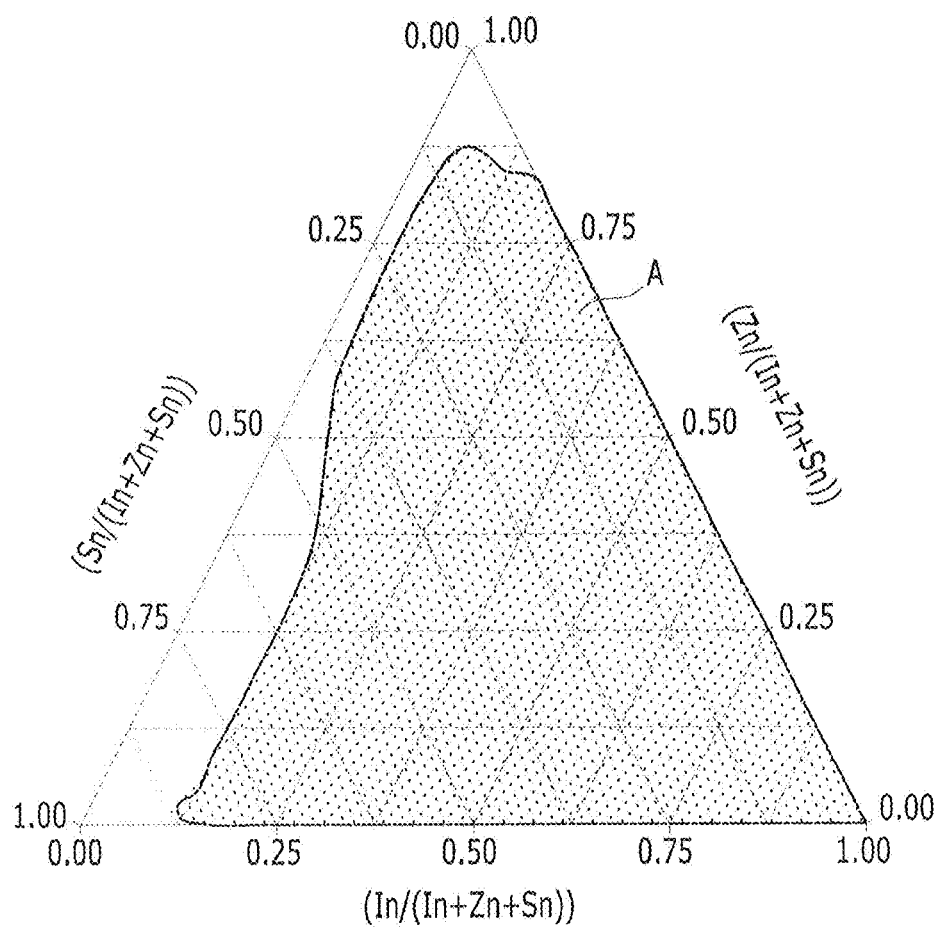
FIG. 10 is a graph illustrating ratios of indium, tin, and zinc according to a mobility characteristic.

FIG. 10 is a graph illustrating ratios of indium, tin, and zinc according to a mobility characteristic. Specifically, FIG. 10 illustrates ratios of indium, tin, and zinc when charge mobility is about 5 cm$^2$/Vs or more.

Data in the following Table 1 denote the ratios of tin and zinc when charge mobility is 5 cm$^2$/Vs or more by using indium as a reference in the graph of FIG. 10.

TABLE 1

| In/In + Zn + Sn | Zn/In + Zn + Sn | Sn/In + Zn + Sn | Zn/In + Zn + Sn | Sn/In + Zn + Sn |
|---|---|---|---|---|
| 5 at % | 59 at % | 36 at % | 84 at % | 11 at % |
| 12 at % | 35 at % | 53 at % | 84 at % | 4 at % |
| 24 at % | entire region | entire region | entire region | entire region |
| 34 at % | entire region | entire region | entire region | entire region |

Referring to FIG. 10, it can be verified that the charge mobility is about 5 cm$^2$/Vs or more in the A region.

Figure 11:
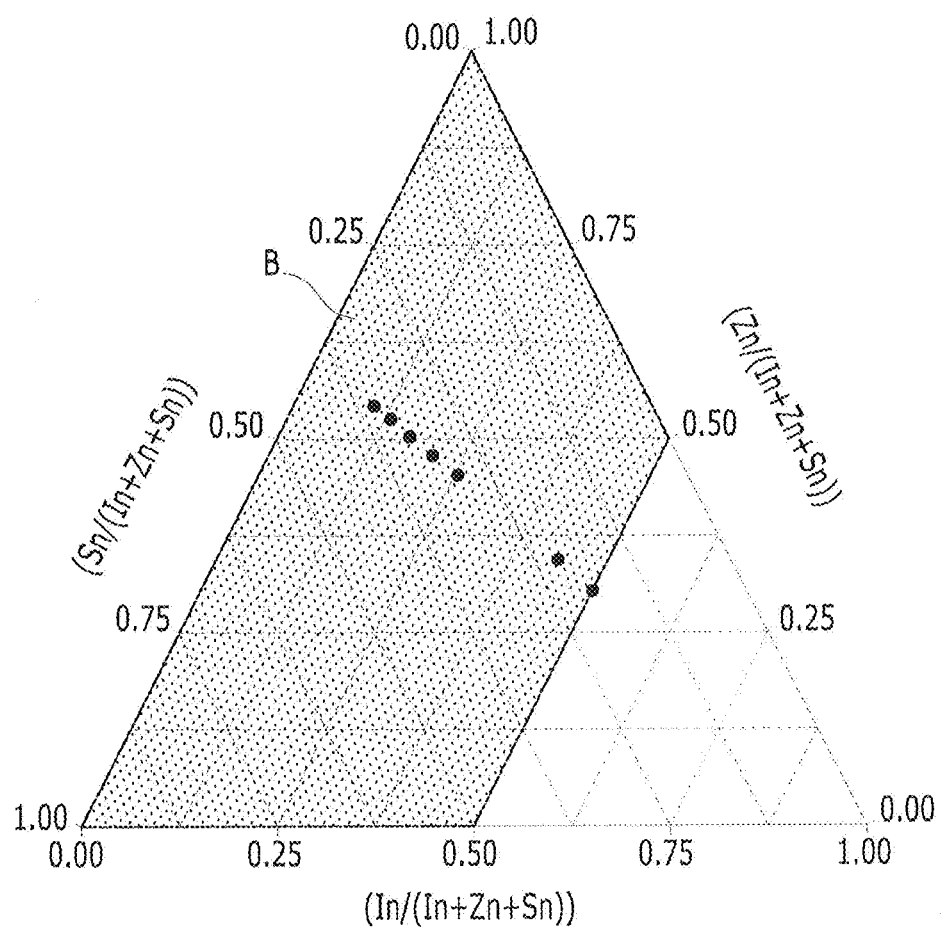
FIG. 11 is a graph illustrating ratios of indium, tin, and zinc according to a threshold voltage characteristic.

FIG. 11 is a graph illustrating ratios of indium, tin, and zinc according to a threshold voltage characteristic. Specifically, FIG. 11 is a graph illustrating ratios of indium, tin, and zinc when the threshold voltage is a minimum of about −10V.

Data in the following Table 2 denote the ratios of indium, tin, and zinc when the threshold voltage is the minimum of about −10V and this data in Table 2 is also illustrated in the graph of FIG. 11.

TABLE 2

| In | Zn | Sn | In/In + Zn + Sn | Zn/In + Zn + Sn | Sn/In + Zn + Sn |
|---|---|---|---|---|---|
| 10.6 | 53.64 | 35.76 | 10.6 at % | 53.6 at % | 35.8 at % |
| 13.6 | 51.84 | 34.56 | 13.6 at % | 51.8 at % | 34.6 at % |
| 17.4 | 49.56 | 33.04 | 17.4 at % | 49.6 at % | 33.0 at % |
| 21.5 | 47.1 | 31.4 | 21.5 at % | 47.1 at % | 31.4 at % |
| 25.7 | 44.58 | 29.72 | 25.7 at % | 44.6 at % | 29.7 at % |
| 43.9 | 33.66 | 22.44 | 43.9 at % | 33.7 at % | 22.4 at % |
| 50 | 30 | 20 | 50.0 at % | 30.0 at % | 20.0 at % |

Referring to FIG. 11, it can be verified that the threshold voltage is the minimum of about −10V in the B region.

Figure 12:
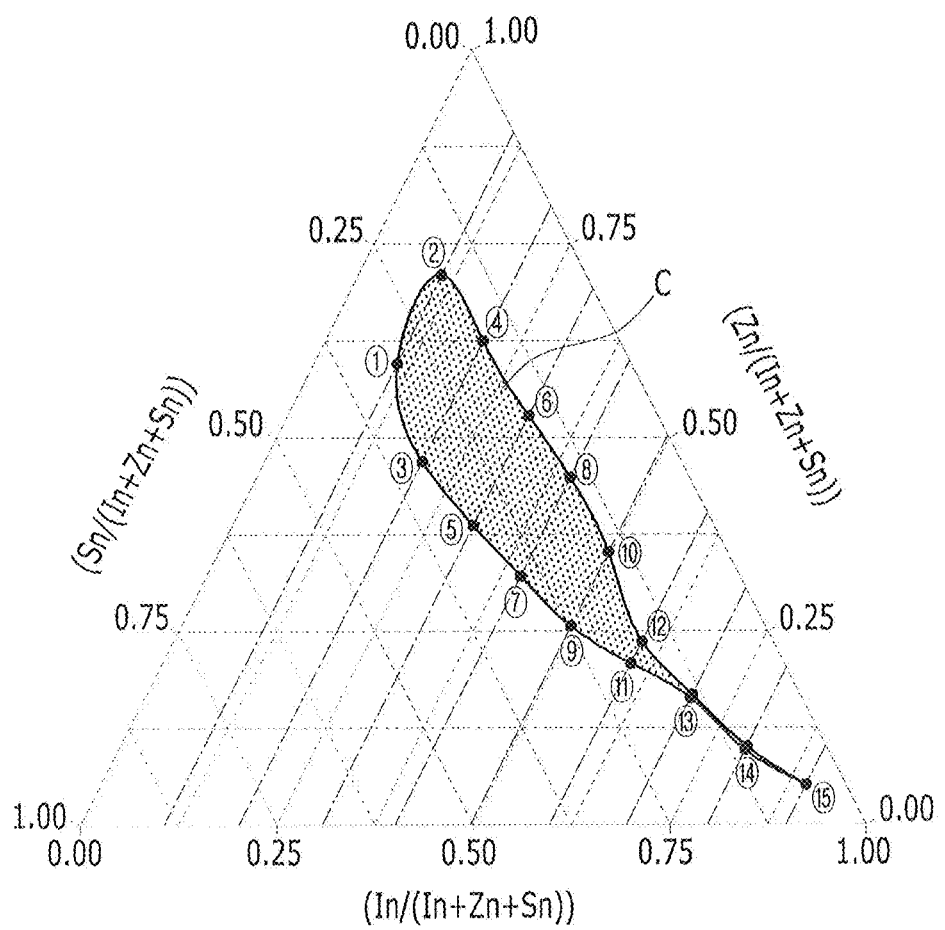
FIG. 12 is a graph illustrating ratios of indium, tin, and zinc according to ranges of an upper limit and a lower limit of an etch rate.

FIG. 12 is a graph illustrating ratios of indium, tin, and zinc according to ranges of an upper limit and a lower limit of an etch rate. Specifically, FIG. 12 illustrates the ratios of indium, tin, and zinc when the etch rate of the semiconductor layer is about 10 Å/second to about 200 Å/second.

Data in the following Table 3 denote the ratios of indium, tin, and zinc when the etch rate of the semiconductor layer is about 10 Å/second to about 200 Å/second and this data in Table 3 is also illustrated in the graph of FIG. 12. Data denoting the ratios of indium, tin, and zinc in Table 3 correspond to ① to ⑮ represented in FIG. 12, respectively.

TABLE 3

| In (at %) | Zn (at %) | Sn (at %) |
|---|---|---|
| 10 | 60 | 30 |
| 10 | 71.6 | 18.4 |
| 20 | 46.6 | 33.3 |
| 20 | 61.8 | 18.2 |
| 30 | 38.2 | 31.8 |
| 30 | 53.3 | 16.7 |
| 40 | 30.7 | 29.3 |
| 40 | 43.8 | 16.2 |
| 50 | 25 | 25 |
| 50 | 33.9 | 16.1 |
| 60 | 20 | 20 |
| 60 | 22.6 | 17.4 |
| 70 | 15 | 15 |
| 80 | 10 | 10 |
| 90 | 5 | 5 |

Referring to FIG. 12, it can be verified that the etch rate of the semiconductor layer is about 10 Å/second to about 200 Å/second in the C region.

Figure 13:
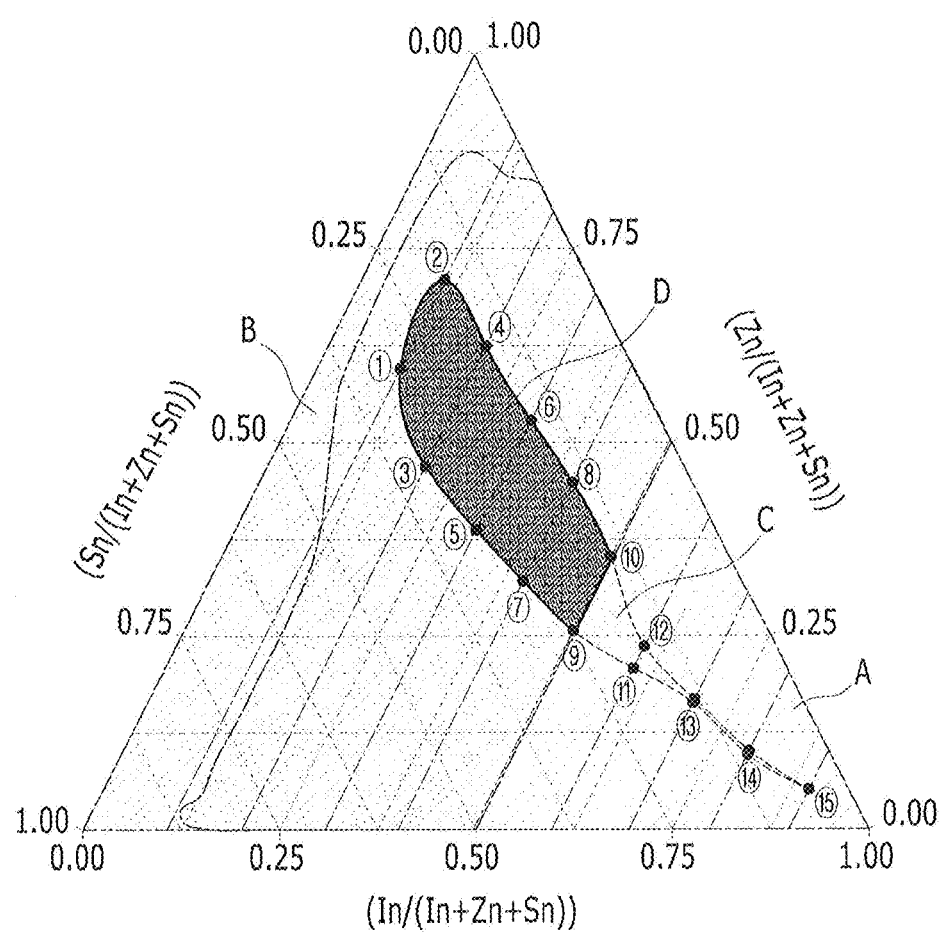
FIG. 13 is a graph illustrating ratios of indium, tin, and zinc according to a mobility characteristic, a threshold voltage characteristic, and an etch rate characteristic.

FIG. 13 is a graph illustrating ratios of indium, tin, and zinc according to a mobility characteristic, a threshold voltage characteristic, and an etching rate characteristic. Specifically, FIG. 13 illustrates the ratios of indium, tin, and zinc when the charge mobility is about 5 cm$^2$/Vs or more, the threshold voltage is a minimum of about −10V, and the etch rate of the semiconductor layer is about 10 Å/second to about 200 Å/second.

Data in the following Table 4 denote the ratios of the indium, tin, and zinc when the charge mobility is about 5 cm$^2$/Vs or more, the threshold voltage is a minimum of about −10V, and the etch rate of the semiconductor layer is about 10 Å/second to about 200 Å/second and this data in Table 4 is also illustrated in the graph of FIG. 13.

TABLE 4

| In (at %) | Zn (at %) | Sn (at %) |
|---|---|---|
| 10 | 60 | 30 |
| 10 | 71.6 | 18.4 |
| 20 | 46.6 | 33.3 |
| 20 | 61.8 | 18.2 |
| 30 | 38.2 | 31.8 |
| 30 | 53.3 | 16.7 |
| 40 | 30.7 | 29.3 |
| 40 | 43.8 | 16.2 |
| 50 | 25 | 25 |
| 50 | 33.9 | 16.1 |

Referring to FIG. 13, it can be verified that the charge mobility is about 5 cm²/Vs or more, the threshold voltage is the minimum of about −10V, and the etch rate of the semiconductor layer is about 10 Å/second to about 200 Å/second in the D region.

Having described exemplary embodiments of the present invention, it is readily apparent to those of reasonable skill in the art that various modifications can be made without departing from the spirit and scope of the present invention which is defined by the metes and bounds of the appended claims.

What is claimed is:

1. A display device, comprising:
a first substrate;
a gate line disposed on the first substrate and comprising a gate electrode;
a semiconductor layer disposed on the first substrate;
a gate insulating layer disposed between the gate electrode and the semiconductor layer;
a data line disposed on the first substrate and connected to a source electrode; and
a drain electrode facing the source electrode,
wherein the semiconductor layer comprises an oxide semiconductor including indium, tin, and zinc, wherein the indium is present in an amount of about 5 atomic percent (at %) to about 50 at %, and wherein a ratio of the zinc to the tin is about 1.38 to about 3.88.

2. The display device of claim 1, wherein:
the indium is present in an amount of about 10 at % to about 30 at % and
the ratio of the zinc to the tin is about 1.78 to about 2.95.

3. The display device of claim 2, wherein:
an etch rate of the semiconductor layer is about 10 Å/second to about 200 Å/second.

4. The display device of claim 3, wherein:
the semiconductor layer has a same planar pattern as the source electrode, the drain electrode, and the data line except for a channel portion formed in the semiconductor layer.

5. The display device of claim 4, wherein:
a threshold voltage Vth of the semiconductor layer is more than about −10V.

6. The display device of claim 5, wherein:
a charge mobility of the semiconductor layer is about 5 cm2/Vs.

7. The display device of claim 6, wherein:
the gate insulating layer comprises a lower layer and an upper layer.

8. The display device of claim 7, wherein:
the lower layer comprises silicon oxide.

9. The display device of claim 8, wherein:
the upper layer comprises silicon nitride.

10. The display device of claim 9, further comprising:
a passivation layer disposed on the data line and
a pixel electrode disposed on the passivation layer,
wherein the passivation layer has a contact hole and the pixel electrode is connected to the drain electrode through the contact hole.

11. The display device of claim 10, further comprising:
a second substrate facing the first substrate,
wherein a liquid crystal layer is interposed between the first substrate and the second substrate.

12. The display device of claim 1, wherein:
an etch rate of the semiconductor layer is about 10 Å/second to about 200 Å/second.

13. The display device of claim 12, wherein:
the semiconductor layer has a same planar pattern as the source electrode, the drain electrode, and the data line except for a channel portion formed in the semiconductor layer.

14. The display device of claim 13, wherein:
the gate insulating layer comprises a lower layer and an upper layer.

15. The display device of claim 14, wherein:
the lower layer comprises silicon oxide and the upper layer comprises silicon nitride.

16. The display device of claim 15, further comprising:
a passivation layer disposed on the data line and
a pixel electrode disposed on the passivation layer,
wherein the passivation layer has a contact hole and the pixel electrode is connected to the drain electrode through the contact hole.

17. The display device of claim 1, wherein:
the indium is present in an amount of about 10 at % and the ratio of the zinc to the tin is about 1.78 to about 3.88.

18. The display device of claim 1, wherein:
the indium is present in an amount of about 20 at % and the ratio of the zinc to the tin is about 1.50 to about 3.23.

19. The display device of claim 1, wherein:
the indium is present in an amount of about 30 at % and the ratio of the zinc to the tin is about 1.38 to about 2.95.

20. A display device, comprising:
a first substrate;
a gate line disposed on the first substrate and including a gate electrode;
a semiconductor layer disposed on the first substrate;
a gate insulating layer disposed between the gate electrode and the semiconductor layer;
a data line disposed on the first substrate and connected to a source electrode; and
a drain electrode facing the source electrode,
wherein the semiconductor layer comprises an oxide semiconductor including indium, tin, and zinc,
wherein the indium is present in an amount of about 5 atomic percent (at %) to about 50 at %,
wherein the zinc is present in an amount of about 25 at % to about 71.6 at %, and
wherein the tin is present in an amount of about 16.1 at % to about 33.3 at %.

* * * * *